US006238999B1

(12) United States Patent
Dickerson et al.

(10) Patent No.: US 6,238,999 B1
(45) Date of Patent: May 29, 2001

(54) ISOLATION REGION FORMING METHODS

(75) Inventors: David L. Dickerson; Richard H. Lane, both of Boise; Charles H. Dennison, Meridian; Kunal R. Parekh, Boise; Mark Fischer, Boise; John K. Zahurak, Boise, all of ID (US)

(73) Assignee: Micron Technology, Boise, ID (US)

( * ) Notice: Subject to any disclaimer, the term of this patent is extended or adjusted under 35 U.S.C. 154(b) by 0 days.

(21) Appl. No.: 09/520,288

(22) Filed: Mar. 7, 2000

Related U.S. Application Data

(62) Division of application No. 09/146,838, filed on Sep. 3, 1998.

(51) Int. Cl.[7] .................................................. H01L 21/762
(52) U.S. Cl. ......................... 438/424; 257/510; 438/445
(58) Field of Search ................................... 438/424, 445; 257/510

(56) References Cited

U.S. PATENT DOCUMENTS

| 4,663,832 | 5/1987 | Jambotkar | 29/576 W |
| 5,356,828 | 10/1994 | Swan et al. | 438/433 |
| 5,397,733 | 3/1995 | Jang | 438/439 |
| 5,677,233 | 10/1997 | Abiko | 437/67 |
| 5,712,185 | 1/1998 | Tsai et al. | 437/67 |
| 5,728,620 | * 3/1998 | Park | 438/425 |

(List continued on next page.)

FOREIGN PATENT DOCUMENTS

| 0 782 185 A2 | 2/1997 | (EP) . |
| 0 782 185 A3 | 2/1997 | (EP) . |

OTHER PUBLICATIONS

A. Chatterjee et al., *A Study of Integration Issues in Shallow Trench Isolation for Deep Submicron CMOS Technologies*, 2875 SPIE 39–43.

IBM Corp., *Optimized Shallow Trench Isolation Structure and Its Process for Eliminating Shallow Trench Isolation–Induced Parasitic Effects*, 34 IBM Technical Disclosure Bulletin, No. 11, pp. 276–277 (Apr. 1992).

*Primary Examiner*—Olik Chaudhuri
*Assistant Examiner*—Anh Duy Mai
(74) *Attorney, Agent, or Firm*—Wells, St. John, Roberts, Gregory & Matkin, P.S.

(57) ABSTRACT

In one aspect, the invention includes an isolation region forming method comprising: a) forming an oxide layer over a substrate; b) forming a nitride layer over the oxide layer, the nitride layer and oxide layer having a pattern of openings extending therethrough to expose portions of the underlying substrate; c) etching the exposed portions of the underlying substrate to form openings extending into the substrate; d) after etching the exposed portions of the underlying substrate, removing portions of the nitride layer while leaving some of the nitride layer remaining over the substrate; and e) after removing portions of the nitride layer, forming oxide within the openings in the substrate, the oxide within the openings forming at least portions of isolation regions. In another aspect, the invention includes an isolation region forming method comprising: a) forming a silicon nitride layer over a substrate; b) forming a masking layer over the silicon nitride layer; c) forming a pattern of openings extending through the masking layer to the silicon nitride layer; d) extending the openings through the silicon nitride layer to the underlying substrate, the silicon nitride layer having edge regions proximate the openings and having a central region between the edge regions; e) extending the openings into the underlying substrate; f) after extending the openings into the underlying substrate, reducing a thickness of the silicon nitride layer at the edge regions to thin the edge regions relative to the central region; and g) forming oxide within the openings.

7 Claims, 15 Drawing Sheets

U.S. PATENT DOCUMENTS

| | | | |
|---|---|---|---|
| 5,780,346 | | 7/1998 | Arghavani et al. .................. 438/296 |
| 5,801,083 | * | 9/1998 | Yu et al. .............................. 438/424 |
| 5,863,827 | | 1/1999 | Joyner ................................. 438/425 |
| 5,895,254 | | 4/1999 | Huang et al. ........................ 438/424 |
| 5,904,538 | * | 5/1999 | Son et al. ............................ 438/424 |
| 5,933,749 | | 8/1999 | Lee ...................................... 438/435 |
| 5,937,308 | | 8/1999 | Gardner et al. ...................... 438/424 |
| 5,960,297 | | 9/1999 | Saki ..................................... 438/424 |
| 5,962,342 | | 10/1999 | Chuang et al. ...................... 438/692 |
| 5,966,614 | * | 10/1999 | Park et al. ........................... 438/424 |
| 5,976,948 | | 11/1999 | Werner et al. ....................... 438/424 |
| 6,083,808 | * | 7/2000 | Shin et al. ........................... 438/424 |

\* cited by examiner

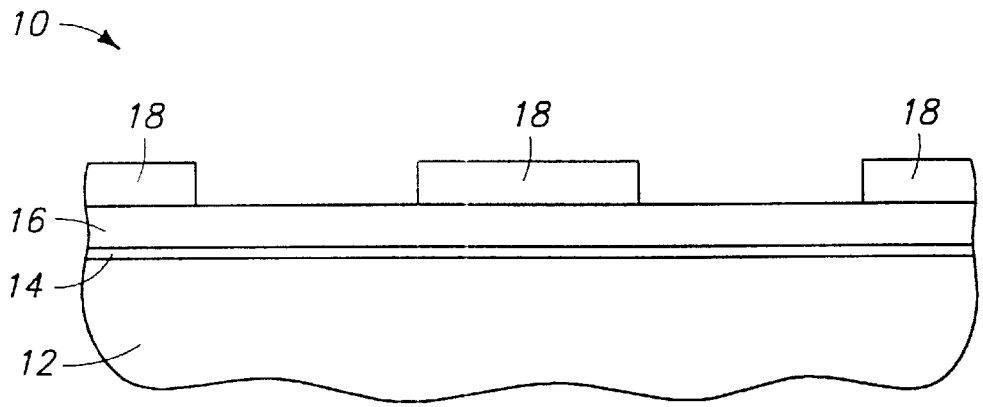
_Fig 1_
PRIOR ART
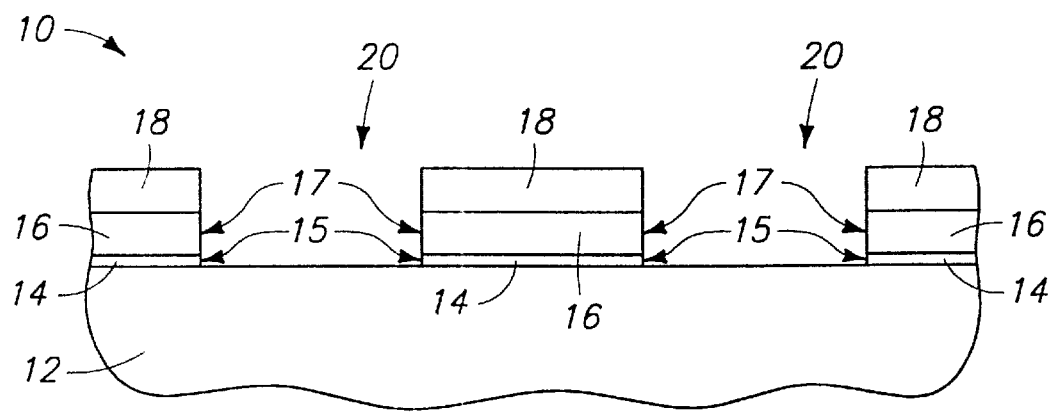
_Fig 2_
PRIOR ART

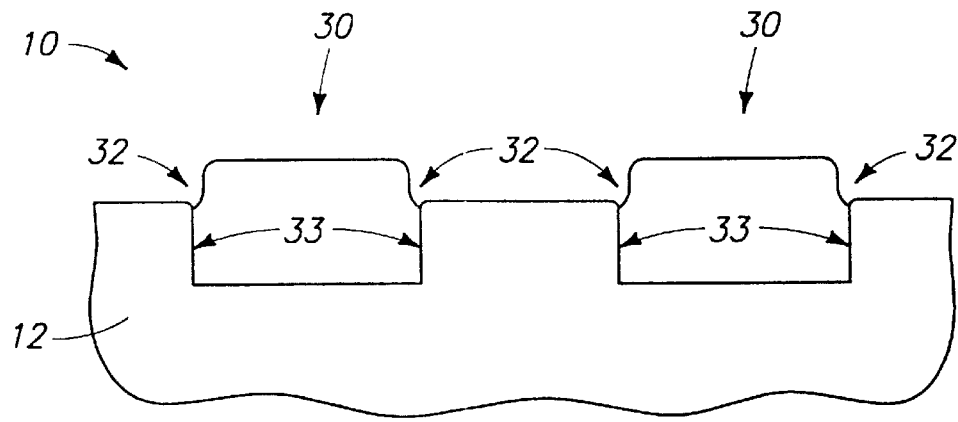
_Fig 9_
_PRIOR ART_
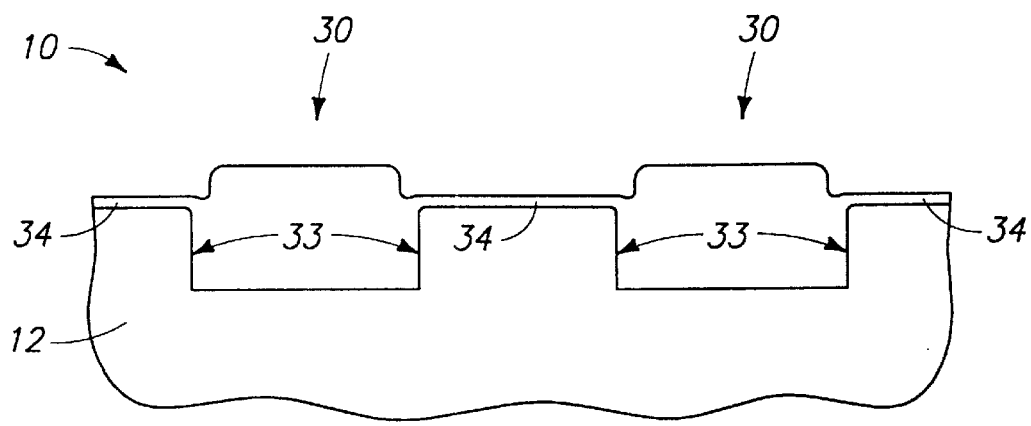
_Fig 10_
_PRIOR ART_

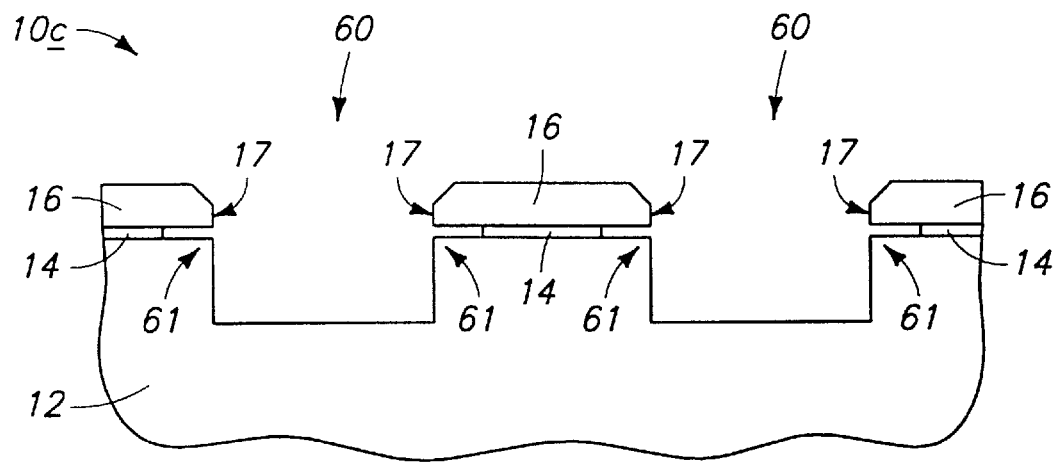
_Fig 23_
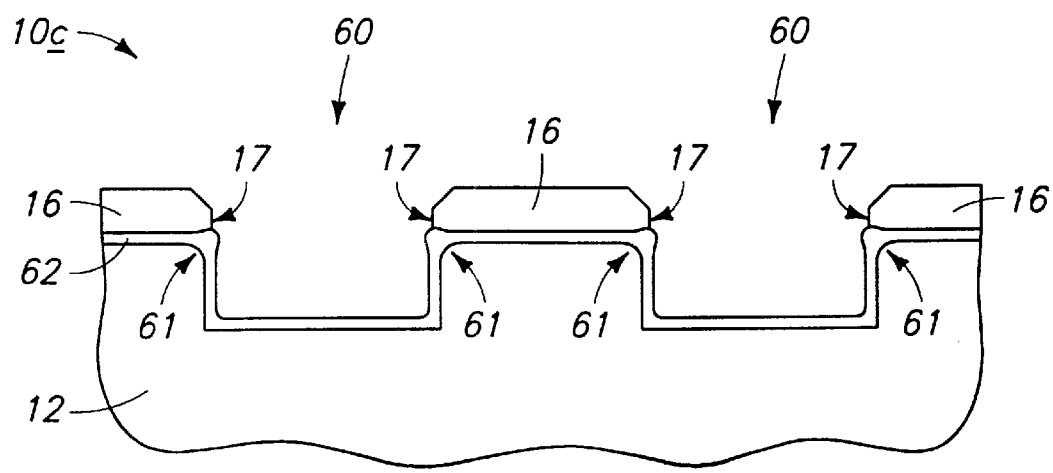
_Fig 24_

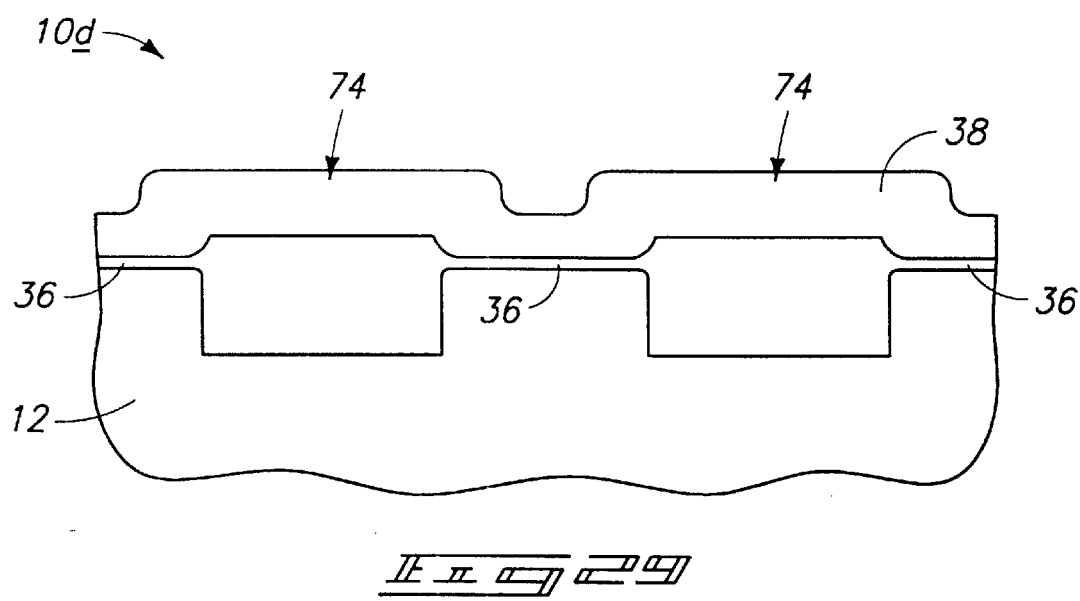

ISOLATION REGION FORMING METHODS

RELATED PATENT DATA

This patent resulted from a divisional application of U.S. patent application Ser. No. 09/146,838, which was filed on Sep. 3, 1998.

TECHNICAL FIELD

The invention pertains to methods of forming isolation regions and can have particular application to methods of forming shallow trench isolation regions.

BACKGROUND OF THE INVENTION

In modern semiconductor device applications, numerous individual devices are packed onto a single small area of a semiconductor substrate. Many of these individuals devices need to be electrically isolated from one another. One method of accomplishing such isolation is to form a trenched isolation region between adjacent devices. Such trenched isolation region will generally comprise a trench or cavity formed within the substrate and filled with an insulative material, such as, for example, silicon dioxide. Trench isolation regions are commonly divided into three categories: shallow trenches (trenches less than about one micron deep); moderate depth trenches (trenches of about one to about three microns deep); and deep trenches (trenches greater than about three microns deep).

Prior art methods for forming trench structures are described with reference to FIGS. 1–12. Referring to FIG. 1, a semiconductor wafer fragment 10 is shown at a preliminary stage of a prior art processing sequence. Wafer fragment 10 comprises a semiconductive material 12 upon which is formed a layer of oxide 14, a layer of nitride 16, and a patterned layer of photoresist 18. Semiconductive material 12 commonly comprises monocrystalline silicon which is lightly doped with a conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Oxide layer 14 typically comprises silicon dioxide, and nitride layer 16 typically comprises silicon nitride. Nitride layer 16 is generally from about 400 Angstroms thick to about 920 Angstroms thick.

Referring to FIG. 2, patterned photoresist layer 18 is used as a mask for an etching process. The etch is typically conducted utilizing dry plasma conditions and $CH_2F_2/CF_4$ chemistry. Such etching. effectively etches both silicon nitride layer 16 and pad oxide layer 14 to form openings 20 extending therethrough. Openings 20 comprise peripheries defined by nitride sidewalls 17 and oxide sidewalls 15. The etching stops upon reaching silicon substrate 12.

Referring to FIG. 3, a second etch is conducted to extend openings 20 into silicon substrate 12. The second etch is commonly referred to as a "trench initiation etch." The trench initiation etch is typically a timed dry plasma etch utilizing $CF_4$/HBr, and typically extends openings 20 to less than or equal to about 500 Angstroms into substrate 12. A purpose of the trench initiation etch can be to clean an exposed surface of silicon substrate 12 within openings 20 (i.e., to. remove defects and polymer material) prior to final trenching into substrate 12. Another purpose of the trench initiation etch can be to form polymer over exposed sidewall edges 15 and 17 of oxide layer 14 and nitride layer 16, respectively. Such polymer can alleviate erosion of sidewall edges 15 and 17 during subsequent etching of substrate 12.

Referring to FIG. 4, a third etch is conducted to extend openings 20 further into substrate 12 and thereby form trenches within substrate 12. Extended openings 20 comprise a periphery 22 defined by substrate 12. The third etch typically utilizes an etchant consisting entirely of HBr, and is typically a timed etch. The timing of the etch is adjusted to form trenches within substrate 12 to a desired depth. For instance, if openings 20 are to be shallow trenches, the third etch will be timed to extend openings 20 to a depth of less than or equal to about one micron.

Referring to FIG. 5, photoresist layer 18 (FIG. 4) is removed and a first oxide layer 24 is thermally grown within openings 20 and along the periphery 22 (FIG. 4) defined by silicon substrate 12. The growth of oxide layer 24 can form small bird's beak regions 26 underlying sidewall edges 17 of nitride layer 16.

Referring to FIG. 6, a high density plasma oxide 28 is formed to fill openings 20 (FIG. 5) and overlie nitride layer 16. High density plasma oxide 28 merges with oxide layer 24 (FIG. 5) to form oxide plugs 30 within openings 20 (FIG. 5). Oxide plugs 30 have laterally outermost peripheries 33 within openings 20.

Referring to FIG. 7, wafer fragment 10 is subjected to planarization (such as, for example, chemical-mechanical polishing) to planarize an upper surface of oxide plugs 30. The planarization stops at an upper surface of nitride layer 16.

Referring to FIG. 8, nitride layer 16 is removed to expose pad oxide layer 14 between oxide plugs 30.

Referring to FIG. 9, pad oxide layer (FIG. 8) is removed. The removal of the pad oxide layer leaves dips 32 at edges of oxide plugs 30.

Referring to FIG. 10, a sacrificial oxide layer 34 is grown over substrate 12 and between oxide plugs 30.

Referring to FIG. 11, sacrificial oxide layer 34 (FIG. 10) is removed. Formation and removal of sacrificial oxide layer 34 can be utilized to clean a surface of substrate 12 between oxide plugs 30. As such surface of substrate 12 can be ultimately utilized to form an active area of a transistor device, it is desired that the surface be substantially free of defects. The removal of sacrificial oxide layer 34 can also undesirably exacerbate dips 32.

Referring to FIG. 12, a silicon dioxide layer 36 is regrown between oxide plugs 30, and a polysilicon layer 38 is formed over oxide plugs 30 and oxide layer 36. Polysilicon layer 38 can ultimately be formed into a word line comprising transistor gate regions. Such transistor gate regions can lie between oxide plugs 30. Plugs 30 can then function as trenched isolation regions between transistor devices. Dips 32 can undesirably result in formation of parasitic devices adjacent the transistor devices and ultimately have an effect of lowering a threshold voltage for the transistor devices. Accordingly, it would be desirable to alleviate dips 32. Dips 32 can also interfere with subsequent fabrication processes and, for this reason as well, it would be desirable to alleviate dips 32.

SUMMARY OF THE INVENTION

In one aspect, the invention encompasses an isolation region forming method. An oxide layer is formed over a substrate. A nitride layer is formed over the oxide layer. The nitride layer and oxide layer have a pattern of openings extending therethrough to expose portions of the underlying substrate. The exposed portions of the underlying substrate are etched to form openings extending into the substrate. After etching the exposed portions of the substrate, portions of the nitride layer are removed while leaving some of the nitride layer remaining over the substrate. After removing portions of the nitride layer, oxide is formed within the openings in the substrate. The oxide within the openings forms at least portions of isolation regions.

In another aspect, the invention encompasses another embodiment isolation region forming method. A silicon nitride layer is formed over a substrate. A masking layer is formed over the silicon nitride layer. A pattern of openings is formed to extend through the masking layer and to the silicon nitride layer. The openings are extended through the silicon nitride layer to the underlying substrate. The silicon nitride layer has edge regions proximate the openings and has a central region between the edge regions. The openings are extended into the underlying substrate. After extending the openings into the underlying substrate, a thickness of the silicon nitride layer is reduced at the edge regions to thin the edge regions relative to the central region. Oxide is formed within the openings that are extended into the substrate. The oxide within the openings forms at least portions of isolation regions.

BRIEF DESCRIPTION OF THE DRAWINGS

Preferred embodiments of the invention are described below with reference to the following accompanying drawings.

FIG. 1 is a diagrammatic, fragmentary, cross-sectional view of a semiconductor wafer fragment at a preliminary step of a prior art processing sequence.

FIG. 2 shows the FIG. 1 wafer fragment at a prior art processing step subsequent to that of FIG. 1.

FIG. 9 shows the FIG. 1 wafer fragment at a prior art processing step subsequent to that of FIG. 8.

FIG. 10 shows the FIG. 1 wafer fragment at a prior art processing step subsequent to that of FIG. 9.

FIG. 23 shows the FIG. 22 wafer fragment at a processing step subsequent to that of FIG. 22.

FIG. 24 shows the FIG. 22 wafer fragment at a processing step subsequent to that of FIG. 23.

FIG. 29 shows the FIG. 26 wafer fragment at a processing step subsequent to that of FIG. 28.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present invention encompasses methods which can alleviate the dips 32 described above with reference to the prior art processing shown in FIGS. 1–12. A first embodiment of the present invention is described with reference to FIGS. 13–16. In describing the first embodiment, similar numbering to that utilized above in describing the prior art processing of FIGS. 1–12 will be used, with differences indicated by suffix "a" or by different numerals.

Figure 13:
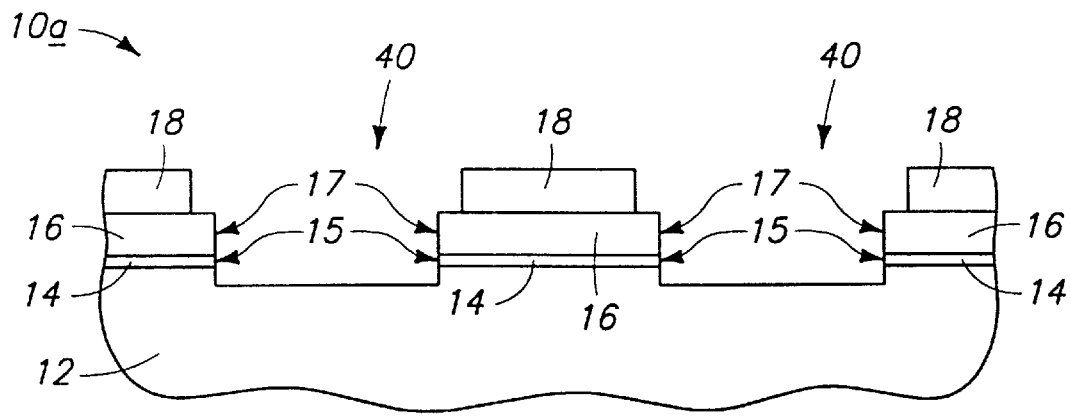
FIG. 13 is a schematic, fragmentary, cross-sectional view of a semiconductor wafer fragment in process according to a first embodiment method of the present invention. The processing step illustrated in FIG. 13 is subsequent to the prior art processing step shown in FIG. 3.

FIG. 13 illustrates a semiconductor wafer fragment 10a at a preliminary stage of the first embodiment method. Specifically, wafer fragment 10a is illustrated at a processing step subsequent to the prior art step of FIG. 3. Wafer fragment 10a comprises a semiconductive substrate 12, an oxide layer 14, a nitride layer 16, and a photoresist layer 18. Openings 40 extend through oxide layer 14 and nitride layer 16 and into substrate 12. Oxide layer 14 and nitride layer 16 ultimately function as masking layers during formation of an isolation region, and so can be referred to as a first masking layer 14 and a second masking layer 16.

The formation of openings 40 can be initiated by processing identical to that described above with reference to prior art FIG. 3. Specifically, openings 20 (FIG. 3) are formed by transferring a pattern from photoresist layer 18 through first and second masking layers 14 and 16. Openings 20 (FIG. 3) are then extended into openings 40 by etching photoresist layer 18. Such etching reduces a horizontal width of photoresist layer 18 and thereby exposes portions of underlying second masking layer 16. The etch of photoresist layer 18 can comprise, for example, a dry etch utilizing a mixture of an oxygen-containing material and He. The oxygen-containing material can comprise, for example, $O_2$ present in a concentration greater than or equal to about 10%. Alternatively, the etch can be a dry etch utilizing 100% $O_2$. The etch will generally remove photoresist faster with higher concentrations Of $O_2$ utilized in the etch than with lower concentrations Of $O_2$. In embodiments in which masking layers 14 and 16 comprise oxide and nitride, respectively, the above-described etch conditions can also remove polymer from exposed portions of nitride layer 16 and oxide layer 14. Such polymer is described in the "Background" section of this disclosure with reference to FIG. 3, and is described as protecting nitride sidewalls 17 and oxide sidewalls 15 during a silicon etch described with reference to FIG. 4. Accordingly, removal of such polymer layer can increase susceptibility of layers 14 and 16 to a subsequent silicon etch.

Figure 14:
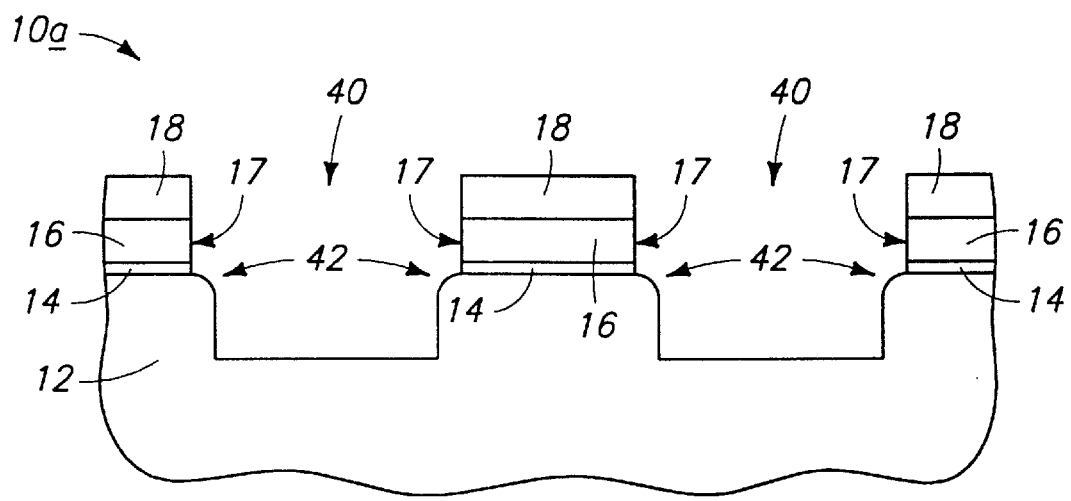
FIG. 14 shows the FIG. 13 wafer fragment at a processing step subsequent to that of FIG. 13.

Referring to FIG. 14, wafer fragment 10a is subjected to a silicon etch, such as, for example, the HBr etch described above with reference to FIG. 4. Such etch extends openings 40 into substrate 12 and also removes exposed portions of nitride layer 16 and oxide layer 14. Accordingly, the etch moves a furthest lateral periphery of the second masking layer (defined by sidewalls 17) outward from the opening without reducing a thickness of the second masking layer. After the etching, openings 40 comprise a step 42 (corresponding to rounded corners) below oxide layer 14. Step 42 defines a region where a wider upper portion of an opening 40 joins to a narrower lower portion of the opening 40.

Figure 3:
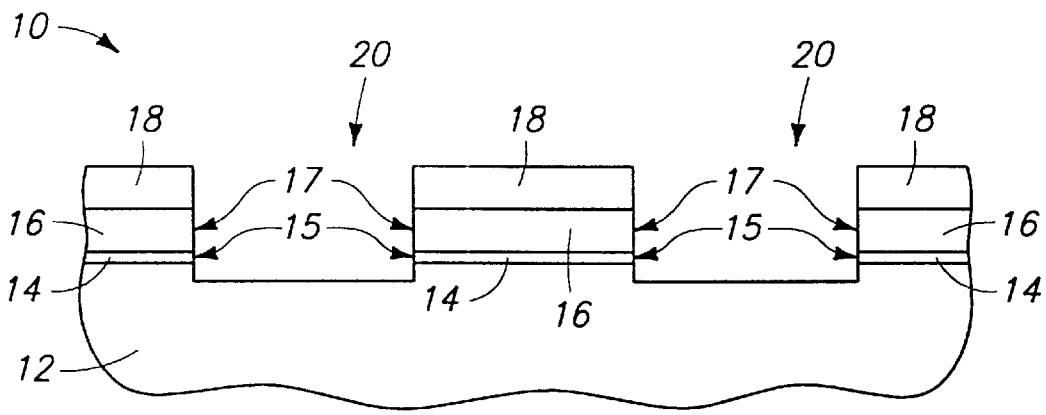
FIG. 3 shows the FIG. 1 wafer fragment at a prior art processing step subsequent to that of FIG. 2.
Figure 4:
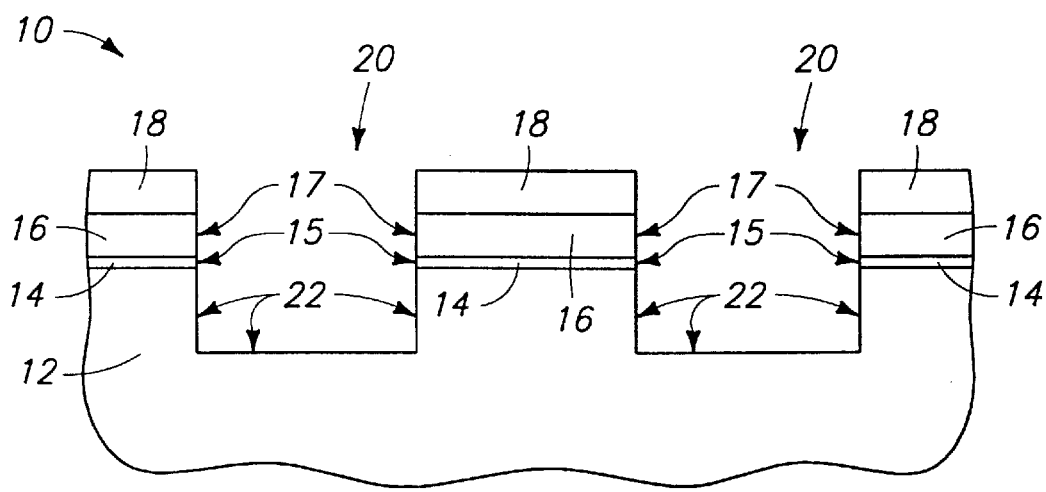
FIG. 4 shows the FIG. 1 wafer fragment at a prior art processing step subsequent to that of FIG. 3.
Figure 5:
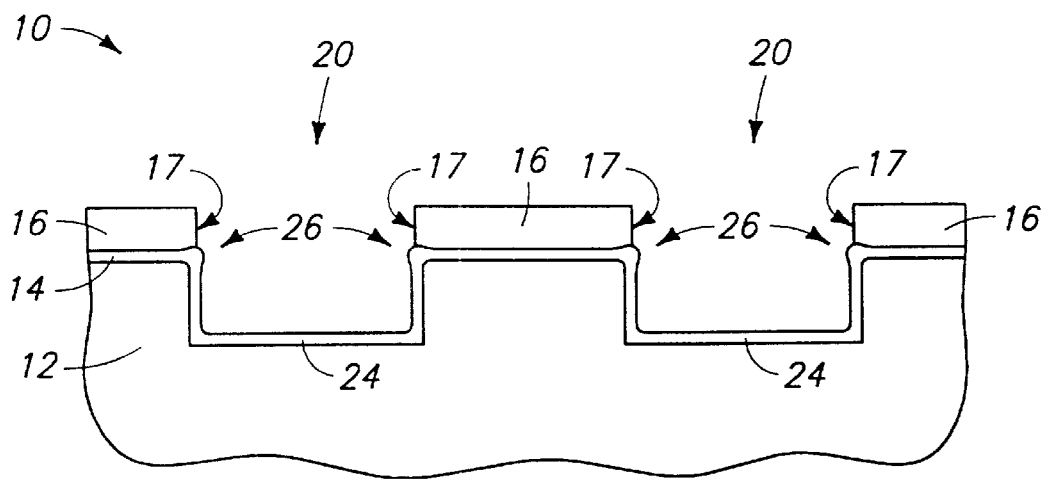
FIG. 5 shows the FIG. 1 wafer fragment at a prior art processing step subsequent to that of FIG. 4.
Figure 6:
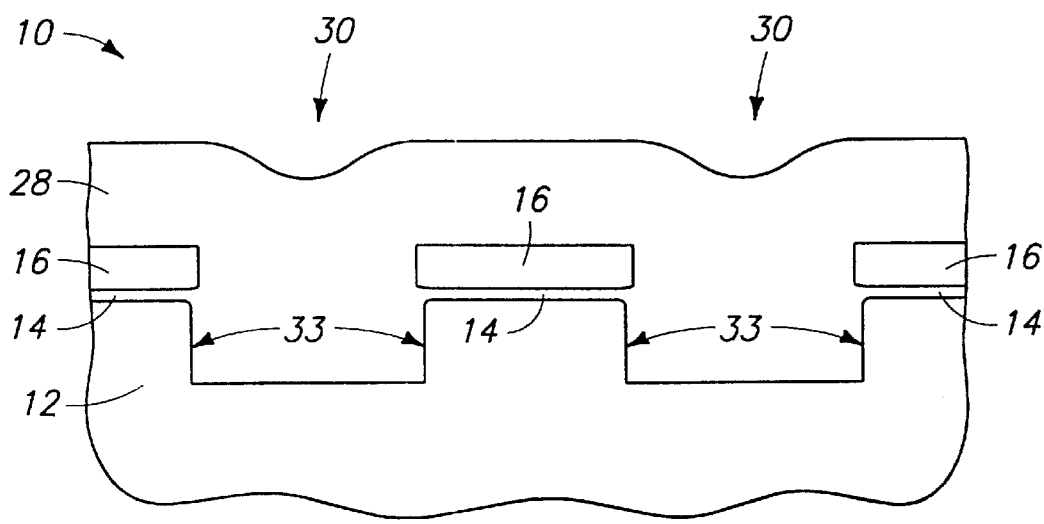
FIG. 6 shows the FIG. 1 wafer fragment at a prior art processing step subsequent to that of FIG. 5.
Figure 7:
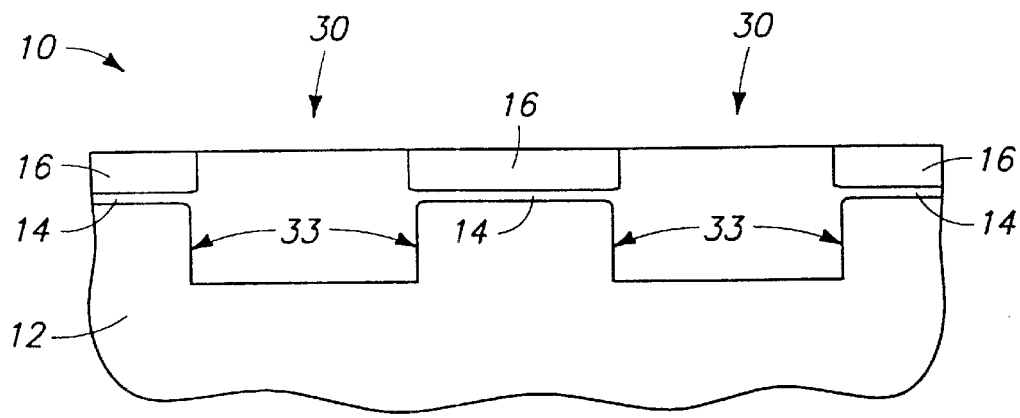
FIG. 7 shows the FIG. 1 wafer fragment at a prior art processing step subsequent to that of FIG. 6.
Figure 8:
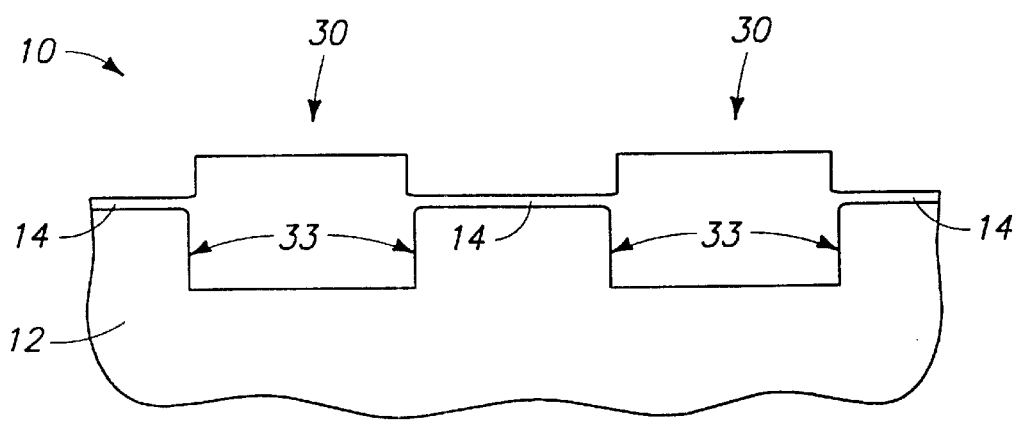
FIG. 8 shows the FIG. 1 wafer fragment at a prior art processing step subsequent to that of FIG. 7.
Figure 11:
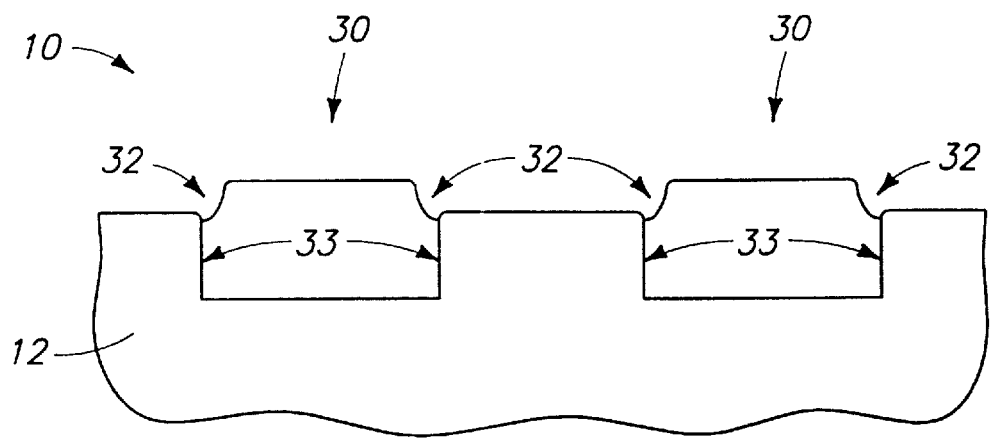
FIG. 11 shows the FIG. 1 wafer fragment at a prior art processing step subsequent to that of FIG. 10.
Figure 12:
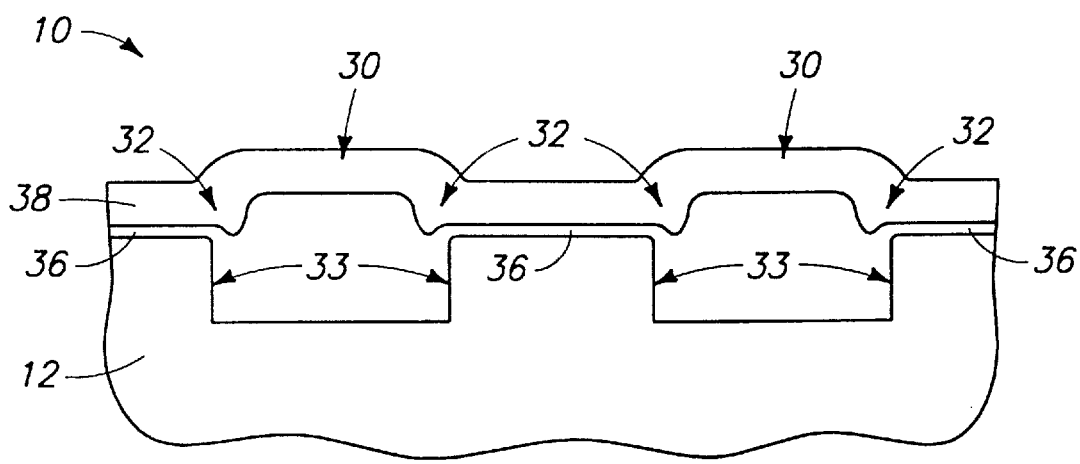
FIG. 12 shows the Fig, 1 wafer fragment at a prior art processing step subsequent to that of FIG. 11.
Figure 15:
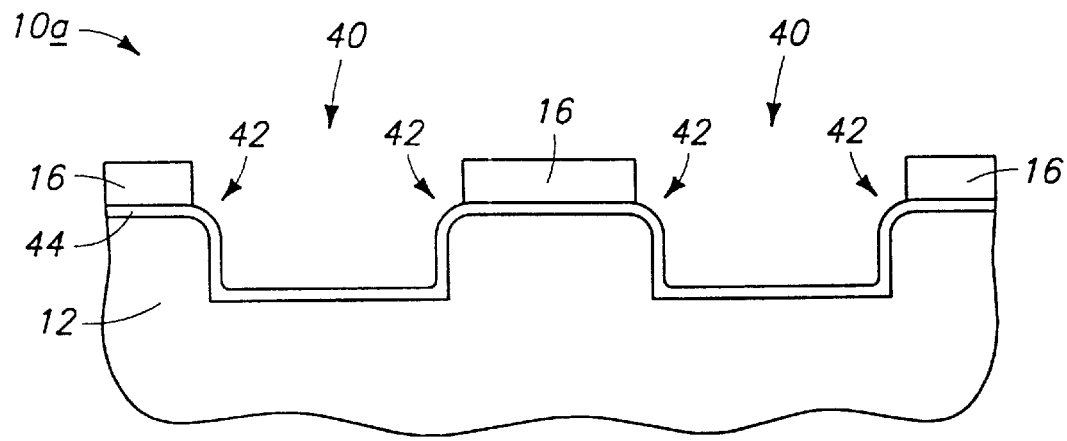
FIG. 15 shows the FIG. 13 wafer fragment at a processing step subsequent to that of FIG. 14.

Referring to FIG. 15, photoresist layer 18 (FIG. 14) is removed and an oxide layer 44 is thermally formed within openings 40 by, for example, a process analogous to that discussed above with reference to the prior art wafer fragment of FIG. 5. An exemplary process for thermally growing oxide is to expose wafer fragment 10a to a mixture of Ar and $O_2$, at a temperature of about 1050° C. and a pressure of about 1 atmosphere, for a time of from about 10 to about 15 minutes. After the formation of oxide layer 44, subsequent processing analogous to that discussed above with reference to FIGS. 6–12 can then be conducted to form isolation regions within openings 40.

Figure 16:
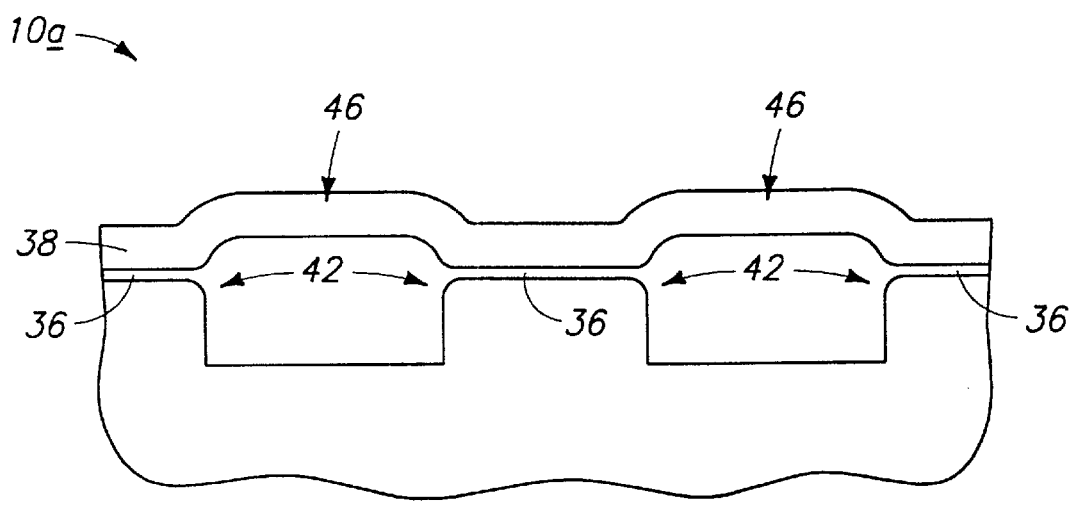
FIG. 16 shows the FIG. 13 wafer fragment at a processing step subsequent to that of FIG. 15.

FIG. 16 illustrates wafer fragment 10a after such subsequent processing. Specifically, FIG. 16 shows wafer fragment 10a after isolation regions 46 have been formed within openings 40 (FIG. 15), and after a polysilicon layer 38 is provided over the isolation regions. As shown, steps 42 define an outer lateral periphery of isolation regions 46. Such outer periphery is further outward than an outward periphery 33 of isolation regions 30 of FIG. 12. Such has resulted in the alleviation (shown as elimination) of dips 32 (FIG. 12) of the prior art isolation regions.

A second embodiment method of the present invention is described with reference to FIGS. 17–21. In describing the second embodiment, similar numbering to that utilized in describing the prior art of FIGS. 1–12 will be used, with differences indicated by the suffix "b" or by different numerals.

Figure 17:
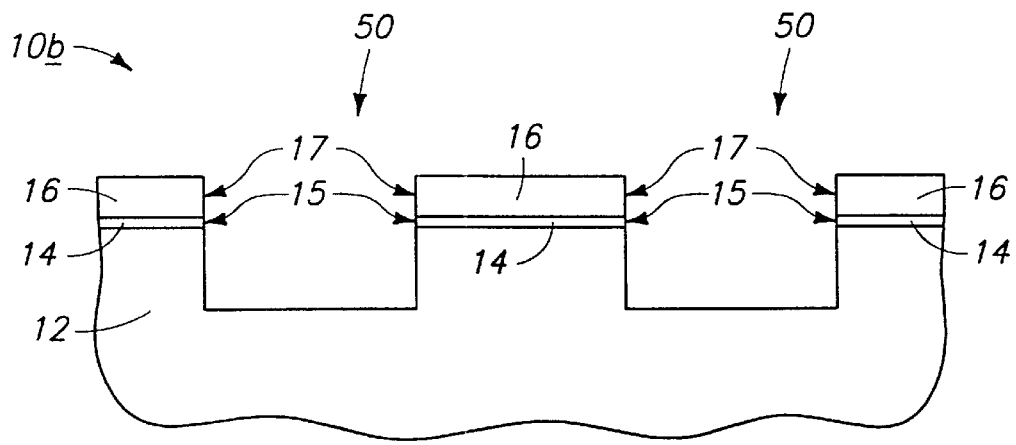
FIG. 17 is a schematic, fragmentary, cross-sectional view of a semiconductor wafer fragment in process according to a second embodiment method of the present invention. The wafer fragment of FIG. 16 is shown at a processing step subsequent to the prior art processing step of FIG. 4.

Referring to FIG. 17, a wafer fragment 10b is illustrated at a preliminary processing step of the second embodiment method. Specifically, wafer fragment 10b is illustrated at a processing step subsequent to the prior art step illustrated in FIG. 4, with photoresist layer 18 (FIG. 4) having been removed. Wafer fragment 10b comprises silicon substrate 12, oxide layer 14, and nitride layer 16, with layers 14 and 16 alternatively being referred to as first and second masking layers, respectively. Openings 50 extend through nitride layer 16 and oxide layer 14, and into substrate 12. Openings 50 can be formed in accordance with the methods described above with reference to FIG. 4 for forming openings 20.

Figure 18:
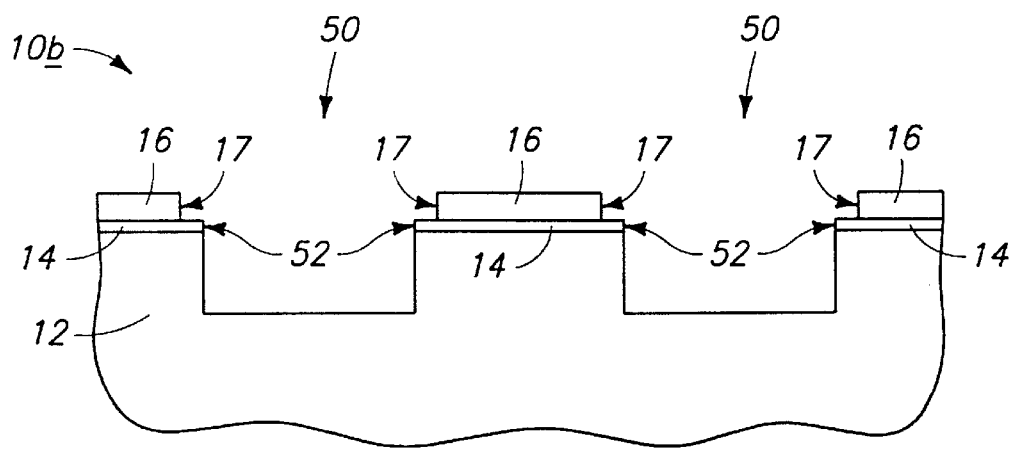
FIG. 18 shows the FIG. 17 wafer fragment at a processing step subsequent to that of FIG. 17.

Referring to FIG. 18, wafer fragment 10b is exposed to a wet etch which isotropically etches nitride layer 16 relative to oxide layer 14 and silicon substrate 12. Such etch can comprise, for example, a dip of wafer fragment 10b into phosphoric acid ($H_3PO_4$) at a temperature of 150° C. and ambient pressure. Such dip has been found to consistently etch silicon nitride at a rate of about 55 Angstroms per minute. The etch reduces a thickness of nitride layer 16 and at the same time moves sidewalls 17 of nitride layer 16 outwardly from openings 50 to widen a top portion of openings 50. The nitride etch thus results in the formation of steps 52 within openings 50. Steps 52 define a location where a wider upper portion of openings 50 joins a narrower lower portion of openings 50. Steps 52 have an upper surface comprising silicon oxide of oxide layer 14.

Preferably, nitride layer 16 has a thickness of at least about 600 Angstroms over substrate 12 after the above-discussed phosphoric acid etch. If remaining nitride layer 16 is less than 600 Angstroms thick, it is found to be less capable of functioning as an etch stop for subsequent etching (such as the etching described with reference to prior art FIG. 7). Typically, from about 50 Angstroms to about 250 Angstroms of nitride is removed from nitride layer 16 during the phosphoric acid etch.

Figure 19:
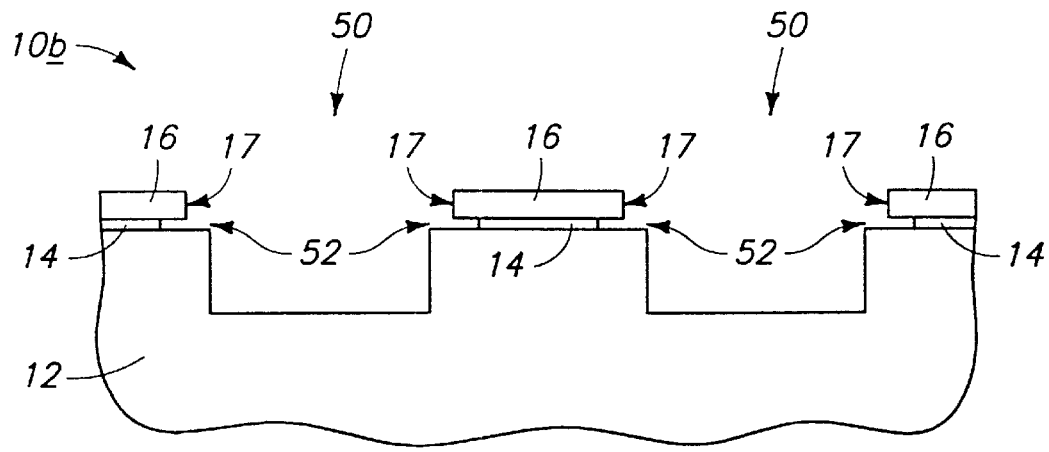
FIG. 19 shows the FIG. 17 wafer fragment at a processing step subsequent to that of FIG. 18.

Referring to FIG. 19, substrate 10b is exposed to a hydrofluoric acid etchant to selectively remove portions of pad oxide layer 14. The removal of portions of pad oxide 14 drops steps 52 to an upper surface of substrate 12. In some applications, it can be equally preferable to forego such pad oxide etch and proceed directly to the oxidation described with reference to FIG. 20.

Figure 20:
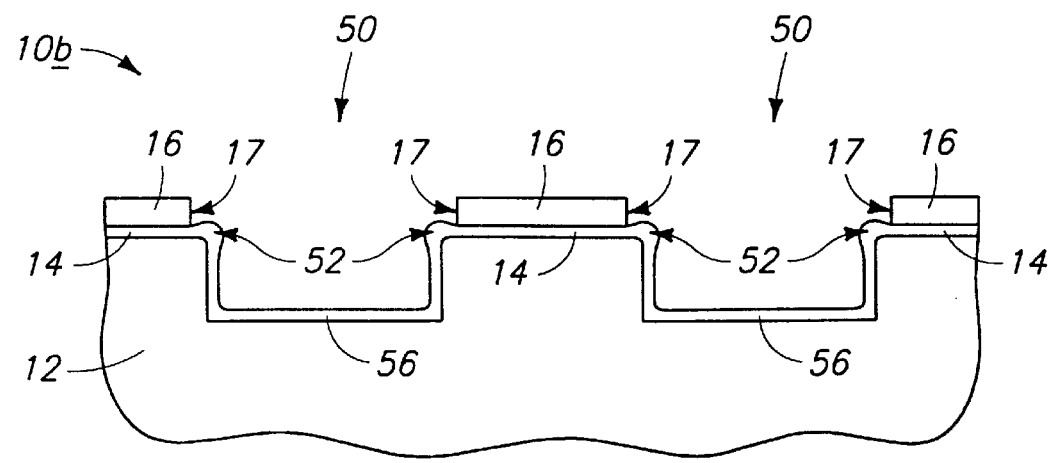
FIG. 20 shows the FIG. 17 wafer fragment at a processing step subsequent to that of FIG. 19.

Referring to FIG. 20, wafer fragment 10b is exposed to oxidizing conditions which form an oxide layer 56 within openings 50. Oxide layer 56 overlies steps 52.

Figure 21:
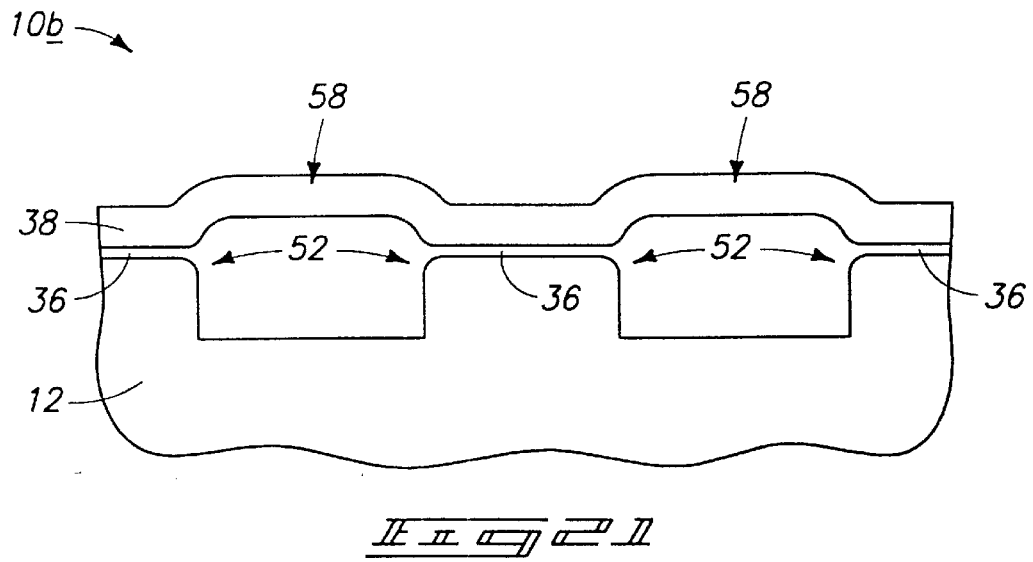
FIG. 21 shows the FIG. 17 wafer fragment at a processing step subsequent to that of FIG. 20.

Referring to FIG. 21, wafer fragment 10b is exposed to subsequent processing analogous to the prior art processing described above with reference to FIGS. 6–12 to form isolation regions 58 and a polysilicon layer 38 overlying isolation regions 58. As shown, steps 52 define an outer lateral periphery of isolation regions 58. Such outer periphery is further outward than an outer periphery 33 of isolation regions 30 of FIG. 12. Such has resulted in the alleviation (shown as elimination) of dips 32 (FIG. 12) of the prior art isolation regions.

A third embodiment of the invention is described with reference to FIGS. 22–25. In describing the third embodiment, similar numbering to that utilized above in describing the first two embodiments will be used, with differences indicated by the suffix "c" or by different numerals.

Figure 22:
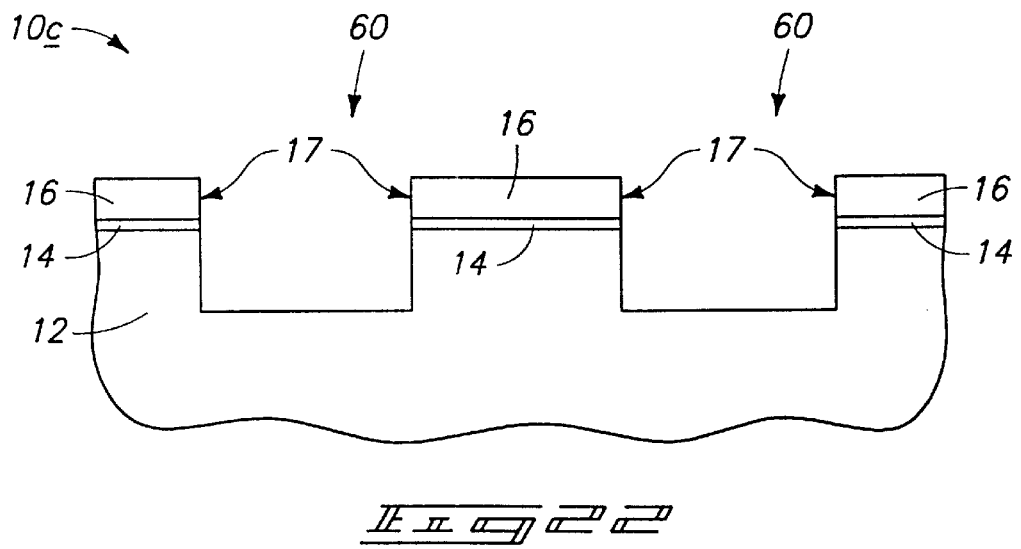
FIG. 22 is a schematic, fragmentary, cross-sectional view of a a semiconductor wafer fragment in process according to a third embodiment method of the present invention. The wafer fragment of FIG. 20 is shown at a processing step subsequent to the prior art processing step of FIG. 4.

Referring to FIG. 22, a wafer fragment 10c is shown at a preliminary stage of the third embodiment processing. Wafer fragment 10c is shown at a processing step subsequent to that of FIG. 4, with a photoresist layer 18 (FIG. 4) having been removed. Wafer fragment 10c comprises a semiconductor substrate 12, a pad oxide layer 14, and a silicon nitride layer 16, with layers 14 and 16 alternatively being referred to as first and second masking layers, respectively. Openings 60 extend through layers 16 and 14, and into substrate 12.

Referring to FIG. 23, nitride layer 16 is subjected to a facet etch to reduce a thickness of portions of nitride layer 16 proximate edges 17. The facet etching can comprise, for example, a plasma etch utilizing argon in combination with a fluorine-containing compound (e.g., $CH_2F_2$). Preferably, the mixture of argon and fluorine-containing gas comprises less than or equal to about 5% fluorine-containing gas (by volume). An exemplary pressure condition of the facet-etching is from about 2 mTorr to about 20 mTorr.

Either before or after the facet etching, wafer fragment 10c is subjected to HF etching to remove portions of oxide layer 14 from under edges 17 of nitride layer 16. The removal of the portions of oxide layer 14 leaves exposed corners 61 of an upper surface of silicon substrate 12.

Referring to FIG. 24, wafer fragment 10c is subjected to oxidation which forms an oxide layer 62 within openings 60. The facet etching of nitride layer 16 prior to thermal oxidation results in rounding of corners 61 due to lifting of the edges of faceted nitride layer 16. The rounding of corners 61 is more pronounced than rounding of any analogous corners in the prior art processing described above with reference to FIG. 5.

Figure 25:
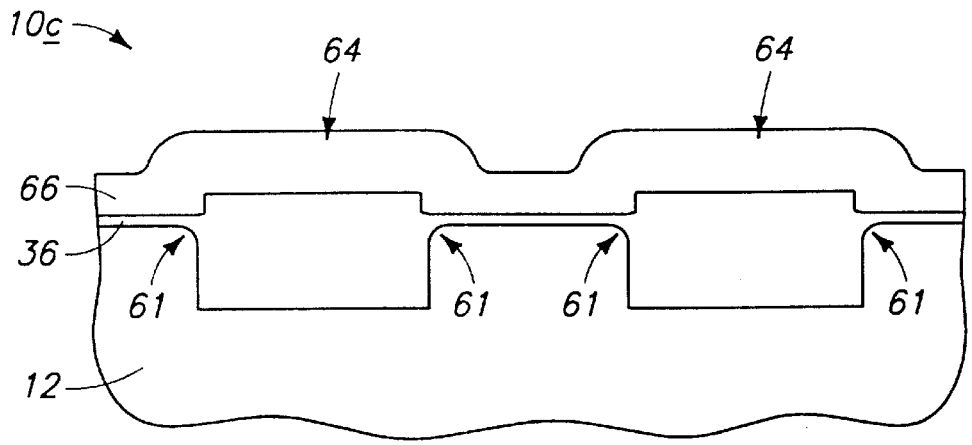
FIG. 25 shows the FIG. 22 wafer fragment at a processing step subsequent to that of FIG. 24.

Subsequent processing analogous to the prior art processing of FIGS. 6–12 results in a structure shown in FIG. 25 comprising isolation regions 64 and a polysilicon layer 66 overlying isolation region 64. It is noted that the faceted edges of nitride layer 16 can lead to overhanging oxide ledges (not shown) of the isolation oxide formed during application of the subsequent processing of FIGS. 6–12 to the structure of FIG. 24. If such overhanging oxide ledges are formed, they are preferably removed prior to formation polysilicon layer 66. Such overhanging oxide ledges can be removed by, for example, chemical-mechanical polishing of the isolation oxide.

FIG. 25 illustrates that rounded corners 61 have alleviated formation of dips 32 (FIG. 12) of the prior art.

A fourth embodiment of the present invention is described with reference to FIGS. 26–29. In describing the fourth embodiment, similar numbering to that utilized above in describing the first three embodiments will be used, with differences indicated by the suffix "d" or by different numerals.

Figure 26:
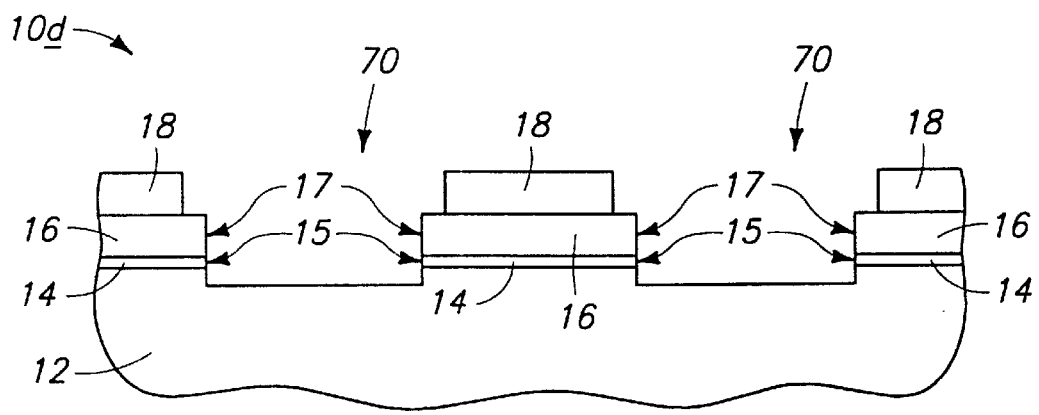
FIG. 26 is a schematic, fragmentary, cross-sectional view of a semiconductor wafer fragment in process according to a fourth embodiment method of the present invention. The wafer fragment of FIG. 26 is shown at a processing step subsequent to the prior art processing step of FIG. 3.

Referring to FIG. 26, a wafer fragment 10d is shown at a preliminary stage of the fourth embodiment method. Specifically, wafer fragment 10d is shown at a processing step subsequent to the prior art processing step of FIG. 3. Wafer fragment 10d comprises a substrate 12, a pad oxide layer 14 and a nitride layer 16, with layers 14 and 16 alternatively being referred to as first and second masking layers, respectively. Additionally, substrate 12 comprises a photoresist layer 18 and openings 70 extending through layers 18, 16 and 14, and into substrate 12. Openings 70 can be formed by, for example, prior art methods described above for forming openings 20 of FIG. 3. After formation of openings 70, photoresist layer 18 is etched back by, for example, a dry etch utilizing an oxygen-containing material, such as the etch described above with reference to FIG. 13. Such etch exposes portions of nitride layer 16, while leaving other portions covered by photoresist 18.

Figure 27:
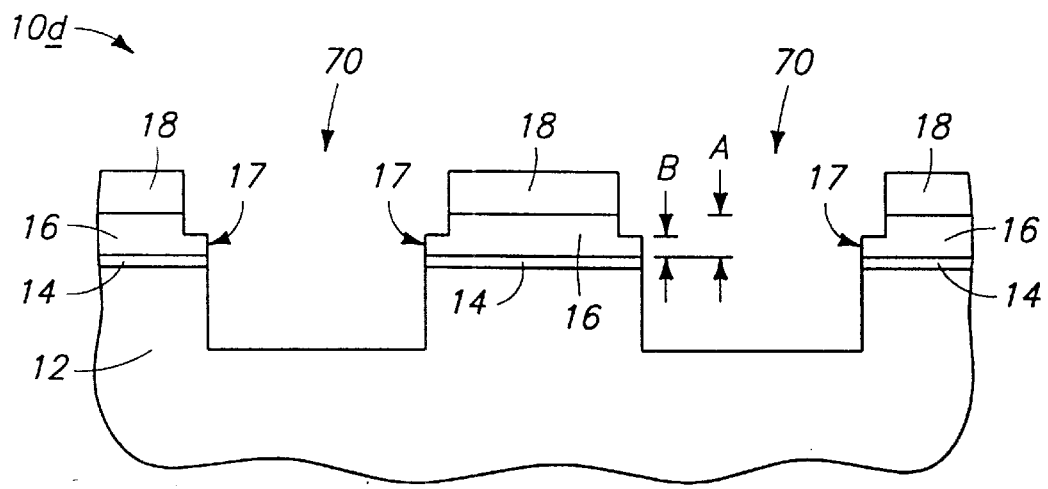
FIG. 27 shows the FIG. 26 wafer fragment at a processing step subsequent to that of FIG. 26.

Referring to FIG. 27, the exposed portions of nitride layer 16 are exposed to additional etching conditions, such as, for example, a phosphoric acid etch as described above with reference to FIG. 18, to reduce a thickness of the exposed portions of the nitride layer. Specifically, the original nitride layer had a thickness of "A" (which remains the thickness of an unetched central region of the nitride layer), and the etched portion of the nitride layer (the edge regions) has a thickness of "B". Preferably, "B" is about one-half "A". The etching does not move the furthest lateral periphery of nitride layer 16 (defined by sidewall 17) outward from openings 70.

Figure 28:
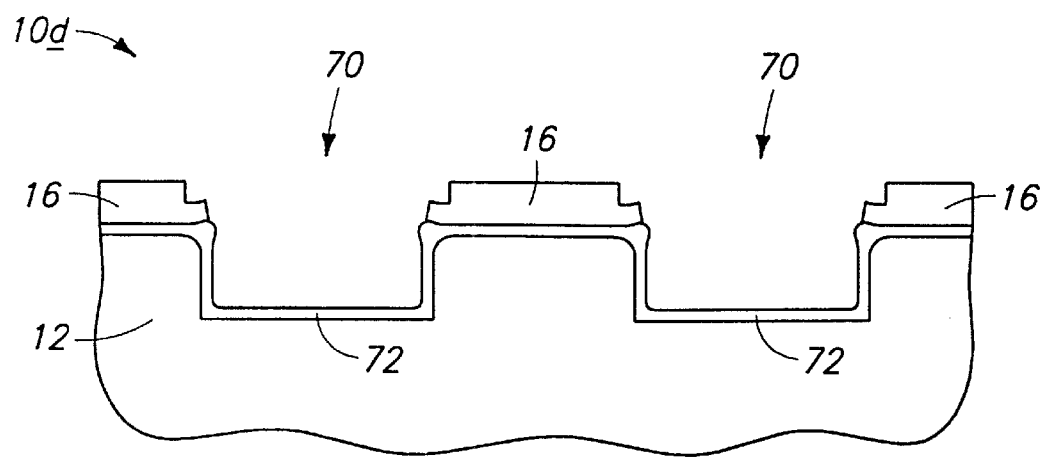
FIG. 28 shows the FIG. 26 wafer fragment at a processing step subsequent to that of FIG. 27.

Referring to FIG. 28, wafer fragment 10d is exposed to oxidizing conditions which grow an oxide layer 72 within openings 70. The thinned regions of nitride layer 16 are relatively easily lifted by the growing oxide such that "birds beaks" are formed under the thinned regions of nitride layer 16. The birds beaks are extended relative to any birds beaks formed during the prior art processing described above with reference to FIG. 5. Photoresist layer 18 is removed prior to the exposure of wafer fragment 10d to oxidizing conditions.

Referring to FIG. 29, wafer fragment 10d is exposed to subsequent processing conditions analogous to the prior art processing described above with reference to FIGS. 6–12 to form isolation regions 74 and polysilicon layer 38 overlying isolation regions 34. It is noted that the reduced-thickness edges of nitride layer 16 can lead to overhanging oxide ledges (not shown) of the isolation oxide formed during application of the subsequent processing of FIGS. 6–12 to the structure of FIG. 27. If such overhanging oxide ledges are formed, they are preferably removed prior to formation polysilicon layer 38. Such overhanging oxide ledges can be removed by, for example, chemical-mechanical polishing of the isolation oxide.

The processing of FIGS. 26–29 alleviates the prior art dips 32 described above in the "Background" section (shown as elimination of dips 32).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An isolation region forming method comprising:

forming a silicon nitride layer over a substrate;

forming a masking layer over the silicon nitride layer;

forming a pattern of openings extending through the masking layer to the silicon nitride layer;

extending the openings through the silicon nitride layer to the underlying substrate with a first etch, the silicon nitride layer comprising edge regions proximate the openings and having a central region between the edge regions;

extending the openings into the underlying substrate with a second etch, the second etch forming a polymer over the edge regions;

after extending the openings into the underlying substrate, exposing the silicon nitride layer and masking layer to dry etching conditions to remove the polymer from the edges of the silicon nitride layer and to remove portions of the masking layer while leaving other portions of the masking layer remaining over the silicon nitride layer;

after the dry etching, further extending the openings into the substrate; and after the further extending, forming oxide within the openings in the substrate, the oxide within the openings forming at least portions of isolation regions.

2. The method of claim 1 wherein the second etch comprises different conditions than the first etch.

3. The method of claim 1 wherein the second etch comprises a dry plasma etch utilizing $CF_4/HBr$ and the first etch comprises a dry plasma etch utilizing at least one of $CF_4$ and $CH_2F_2$.

4. The method of claim 1 further comprising:

forming a silicon oxide layer over the substrate; and the forming the silicon nitride layer comprising forming the silicon nitride layer over the silicon oxide layer.

5. The method of claim 1 wherein the dry etching comprises exposing the silicon nitride layer and masking layer to an oxygen-containing gas.

6. The method of claim 1 wherein the masking layer comprises photoresist and the dry etching comprises exposing the silicon nitride layer and masking layer to an oxygen-containing gas.

7. The method of claim 1 wherein the dry etching comprises exposing the silicon nitride layer and masking layer to $O_2$.

* * * * *